(12) United States Patent
Barry et al.

(10) Patent No.: US 6,922,349 B2
(45) Date of Patent: Jul. 26, 2005

(54) COMPLEMENTARY TWO TRANSISTOR ROM CELL

(75) Inventors: Robert L. Barry, Essex Junction, VT (US); Peter F. Croce, Essex Junction, VT (US); Steven M. Eustis, Essex Junction, VT (US); Yabin Wang, Ithaca, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/864,238

(22) Filed: Jun. 9, 2004

(65) Prior Publication Data

US 2005/0007809 A1 Jan. 13, 2005

Related U.S. Application Data

(62) Division of application No. 10/063,212, filed on Mar. 29, 2002, now Pat. No. 6,778,419.

(51) Int. Cl.⁷ .............................. G11C 17/00; G11C 5/06
(52) U.S. Cl. .............................. 365/94; 365/104; 365/72
(58) Field of Search .......................... 365/94, 104, 72, 365/181

(56) References Cited

U.S. PATENT DOCUMENTS

| | | | | |
|---|---|---|---|---|
| 4,384,399 A | * | 5/1983 | Kuo ............................ | 438/130 |
| 4,591,891 A | * | 5/1986 | Chatterjee et al. .......... | 438/275 |
| 4,802,126 A | | 1/1989 | Takayama | |
| 4,912,674 A | | 3/1990 | Matsumoto et al. | |
| 5,088,060 A | | 2/1992 | Endoh et al. | |
| 5,357,459 A | | 10/1994 | Chapman | |
| 5,493,534 A | | 2/1996 | Mok | |
| 5,631,180 A | | 5/1997 | Gyure et al. | |
| 5,742,614 A | | 4/1998 | Cline | |
| 5,838,046 A | | 11/1998 | Irani et al. | |
| 5,929,494 A | | 7/1999 | Li | |
| 5,986,957 A | | 11/1999 | Ishii | |
| 5,999,449 A | | 12/1999 | Mehta et al. | |
| 6,022,779 A | | 2/2000 | Shin et al. | |
| 6,054,918 A | | 4/2000 | Holst | |
| 6,083,791 A | | 7/2000 | Bergemont | |
| 6,133,100 A | | 10/2000 | Li | |
| 6,157,069 A | | 12/2000 | Shin et al. | |
| 6,317,362 B1 | * | 11/2001 | Nomura et al. .......... | 365/185.2 |
| 6,438,024 B1 | * | 8/2002 | Gold et al. ................ | 365/154 |
| 6,452,248 B1 | * | 9/2002 | Le ............................ | 257/530 |
| 6,518,072 B1 | * | 2/2003 | Huster et al. .................. | 438/4 |
| 6,563,736 B2 | * | 5/2003 | Hsu et al. .............. | 365/185.18 |
| 2001/0021126 A1 | * | 9/2001 | Lavi et al. ............. | 365/185.03 |
| 2001/0021965 A1 | | 9/2001 | Yokota et al. | |
| 2002/0159293 A1 | * | 10/2002 | Hamilton et al. ...... | 365/185.22 |
| 2002/0171101 A1 | | 11/2002 | Hsu et al. | |
| 2002/0179999 A1 | * | 12/2002 | Lee et al. .................... | 257/530 |
| 2003/0123314 A1 | * | 7/2003 | Buer et al. ............... | 365/225.7 |

FOREIGN PATENT DOCUMENTS

| | | |
|---|---|---|
| DE | 4311705 A1 | 10/1993 |
| EP | 0913773 A1 | 5/1999 |
| JP | 59-38998 | 3/1984 |

* cited by examiner

Primary Examiner—Hoai Ho
Assistant Examiner—Ly Duy Pham
(74) Attorney, Agent, or Firm—McGinn & Gibb, PLLC; Richard A. Henkler, Esq.

(57) ABSTRACT

A method and structure for a read only memory (ROM) cell array has the first drain of a first transistor connected to a true bitline and a second drain of a second transistor connected to a complement bitline. The first transistor also includes a first source, and the second transistor includes a second source. The connection of the first source or the second source to ground programs the ROM cell. With the invention, only the first source or the second source is connected to the ground and the other is insulated from electrical connections. Further, the connection of the source to ground comprises an electrical connection formed during manufacturing of the first transistor and the second transistor.

6 Claims, 5 Drawing Sheets

COMPLEMENTARY TWO TRANSISTOR ROM CELL

CROSS-REFERENCE TO RELATED APPLICATIONS

This application is a division of U.S. application Ser. No. 10/063,212 filed Mar. 29, 2002 now U.S. Pat. No. 6,778,419.

BACKGROUND OF THE INVENTION

1. Field of the Invention

The present invention generally relates to read only memory (ROM) devices and more particularly to an improved ROM device that includes complementary transistors which are programmed during manufacture by selective connection of the transistors to ground.

2. Description of the Related Art

Read only memory (ROM) array chips are well known in the art. The chips generally have a ROM array core, that includes a multiplicity of ROM cells, and a periphery formed of control elements controlling the operation of the array core. The ROM array stores programs and/or data in the form of bits, where a bit is either off (a logical value of 1) or on (a logical value of 0). Each bit is stored in a single cell, which is conventionally a single gate, n-channel transistor or ROM cell. A logical 1 is implemented with a transistor which has been shut off, such that it will not conduct when voltage is applied to it and a logical 0 is implemented with an active transistor which conducts when voltage is applied to it.

Further, conventional ROM cells utilize a reference bitline, that has a voltage between the precharge voltage (Vdd) and ground level, to decrease the size of the ROM array and to increase speed. If the ROM cell has a voltage above the reference voltage, it will represent a logical value of 1. If the ROM cell has a voltage below the reference voltage, it will represent a logical value of 0. However, the voltage difference between the high/low voltage and the reference voltage is narrow, which makes it difficult to identify the difference between a logical 1 and a logical 0. Further, each of these three bitline values (high, low, and reference) has a level of uncertainty based on bitline capacitance and bitline—bitline coupling. This uncertainty further reduces signal margin.

In order to save wiring levels, some conventional ROMs program the personality on the bitline side of the transistor. By doing this such designs can form the ROM utilizing only two metal levels. However, programming in this fashion causes the bitline capacitance to vary greatly depending on the ROM's personality. In the prior ROM design, the levels of uncertainty for signal margin were great enough that many "quieting grounds" had to be interspersed among the bitline to reduce bitline—bitline coupling. Such quieting grounds increase the size and decrease the speed of the array.

Therefore, there is a need for an improved ROM cell that avoids the disadvantages associated with single transistor ROM cells and which provides increased performance without substantially increasing the size or decreasing the speed of the ROM array. The invention described below provides such a structure.

BRIEF SUMMARY OF THE INVENTION

In view of the foregoing and other problems, disadvantages, and drawbacks of the conventional ROM devices the present invention has been devised, and it is an object of the present invention to provide a structure and method for an improved ROM device that includes complementary transistors which are programmed during manufacture by selective connection of the transistors to ground.

In order to attain the object(s) suggested above, there is provided, according to one aspect of the invention, a read only memory (ROM) cell array that has the first drain of a first transistor connected to a true bitline and a second drain of a second transistor connected to a complement bitline. The first transistor also includes a first source, and the second transistor includes a second source. The connection of the first source or the second source to ground programs the ROM cell. With the invention, only the first source or the second source is connected to the ground and the other is insulated from electrical connections. Further, the connection of the source to ground comprises an electrical connection formed during manufacturing of the first transistor and the second transistor.

The first transistor and the second transistor include gates connected to or part of a wordline. The second transistor comprises a complement transistor of the first transistor. The ROM cell shares the first drain and the second drain with corresponding drains of an adjacent ROM cells in the array.

The invention also includes a method of forming a read only memory (ROM) cell that includes forming a first drain of a first transistor such that the first drain is connected to a true bitline, forming a second drain of a second transistor such that the second drain is connected to a complement bitline, and forming a first source of the first transistor and a second source of the second transistor such that either the first source or the second source is connected to ground. The connection of the first source or the second source to the ground programs the ROM cell.

The forming of the first source and the second source only connects either the first source or the second source to the ground and insulates the other of source from electrical connections.

BRIEF DESCRIPTION OF THE SEVERAL VIEWS OF THE DRAWINGS

The foregoing, and other objects, aspects, and advantages of the invention will be better understood from the following detailed description of preferred embodiments of the invention with reference to the drawings, in which.

DETAILED DESCRIPTION OF THE INVENTION

DETAILED DESCRIPTION OF PREFERRED EMBODIMENTS OF THE INVENTION

The invention uses a ROM cell that has two transistors per cell instead of one. This uses slightly more area, but offers robustness and performance advantages. With two transistors, a true/complement bitline scheme can be used instead of the bitline reference method. This allows for better signal margin (robustness) and for a quicker sense time (performance). Additionally, with true and complement bitlines, the invention can take advantage of bitline twisting to reduce capacitive coupling effects and further increase robustness.

Figure 1:
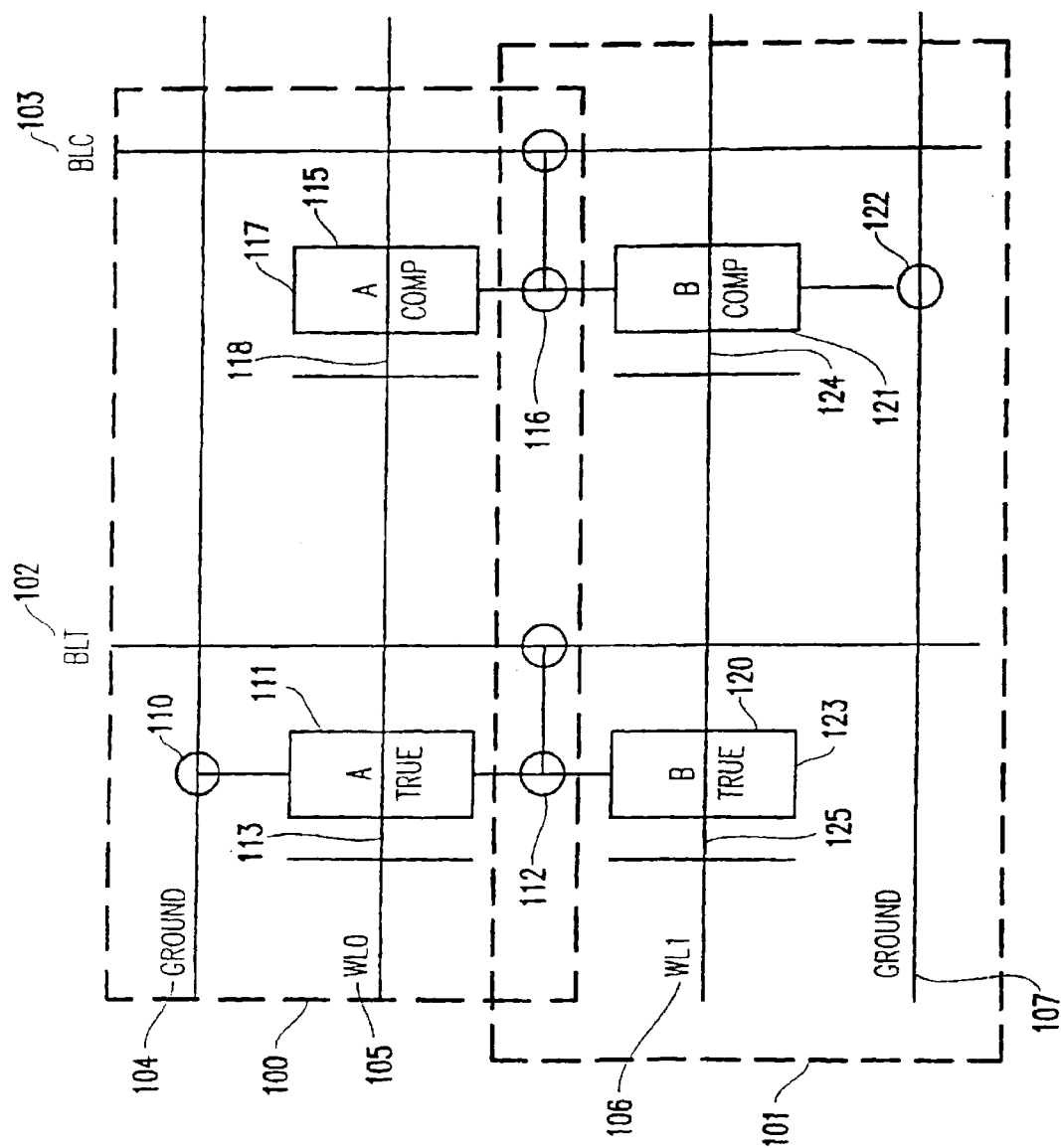
FIG. 1 is a schematic diagram of a two adjacent ROM cells each having two complementary transistors.

FIG. 1 illustrates one example of the inventive ROM cell. One ordinarily skilled in the art would understand that the design shown in FIG. 1 is merely exemplary, and the invention is not limited to the specific layout shown in the drawings. To the contrary, the invention is applicable to all two complementary transistor ROM cell arrangements.

FIG. 1 illustrates two different cells 100, 101 each of the cells includes a true transistor 111, 120 and a complementary transistor 115, 121. The true transistors 111, 120 share a common drain 112 that is connected to the true bitline 102. The true transistor 111 has a source 110 that is connected to ground 104. The source 123 of the true transistor 120 is left floating (insulated from other electrical connections). The wordlines 105, 106 are connected to the gates 113, 125 of the true transistors 111, 120.

The complementary transistors 115, 121 similarly share a common drain 116 and have their gates 118, 124 connected to the word lines 105, 106. The complementary transistor 115 has an electrically insulated floating source 117, while the complementary transistor 121 has a source 122 connected to ground 107.

With the inventive structure, a logical 0 is achieved by having the source of the true transistor connected to ground, while the source of the complementary transistor is left floating. To the contrary, a logical 1 is achieved by having the source of the true transistor electrically insulated (floating), while the source of the complementary transistor is tied to ground. Therefore, the cell 100 represents a logical 0 because the source 117 of the complementary transistor 115 is left floating, while the source 110 of the true transistor 111 is tied to ground 104. To the contrary, cell 101 represents a logical 1 by having the source 123 of the true transistor 120 floating and the source 122 of the complementary transistor 121 connected to ground 107.

In operation, both true and complement bitlines are precharged to VDD. When the wordline voltage rises, the transistors connected to ground will conduct and pull its respective bitline towards ground. The transistor that has its source floating will have no affect on its respective bitline which should maintain a voltage near VDD. If the true transistor pulls the true bitline towards ground while the complement bitline remains near VDD, a logical 0 is read. If the complement transistor pulls the complement bitline towards ground while the true bitline remains near VDD, a logical 1 is read. Note also that, since drains are always connected to the bitlines, all bitlines will have approximately the same capacitance.

Figure 2:
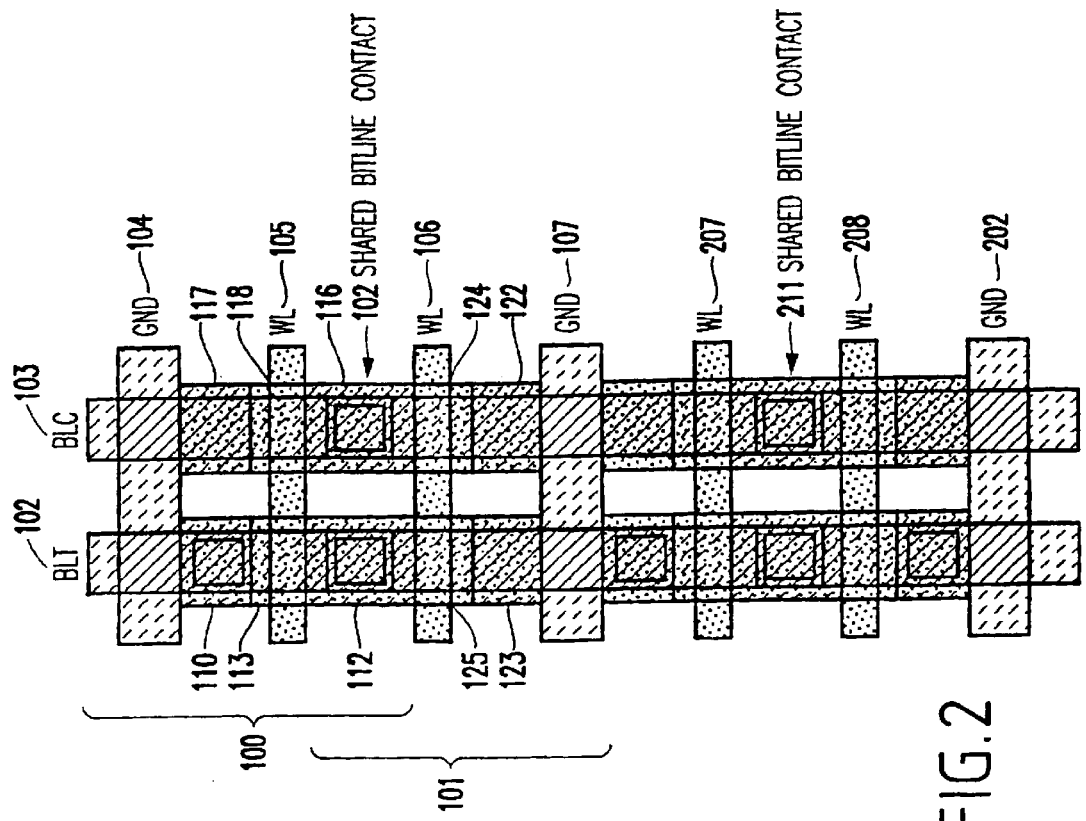
FIG. 2 is a schematic diagram illustrating a series of ROM cells along true and complement bitlines.

FIG. 2 is a schematic design illustration showing the conductive connections in a series of ROM cells. The cells 100, 101, discussed above, are also shown in FIG. 2 and the same items are identified with the same reference numbers. In addition, FIG. 2 illustrates additional cells that utilize wordlines 207, 208, and ground 202 and share bitline 102 and 103. As shown, the invention reduces the size of the array by allowing the drain 112 to be shared between adjacent cells. In addition, with respect to cell 100, the source 110 of the true transistor is shown as being connected to ground 104, while the source 117 of the complementary transistor is shown as floating. In FIG. 2, the double boxes and triple boxes represent connections that pass between different layers. Therefore, the double boxes shown in items 110 and 122 represent a connection between the ground and the adjacent source region. Also, with respect to cell 101, the source 123 of the true transistor is floating while the source 122 of the complementary transistor is shown as being connected to ground 107. As would be known by one ordinarily skilled in the art, this illustration is of a small portion of the array and the array would include hundreds of thousands of such complementary cells.

As shown in FIG. 2, the invention uses three levels of metal. Capacitance similarities are stabilized by using three levels of metal and programming on the ground side of the transistor. This reduces the total diffusion capacitance of the bitline by one-half (since the bitline contact to the transistor can be shared between two transistors) and makes capacitance constant across all bitlines. Due to these enhancements, the levels of uncertainty for the two transistor ROM are significantly reduced and insignificant.

Figure 7:
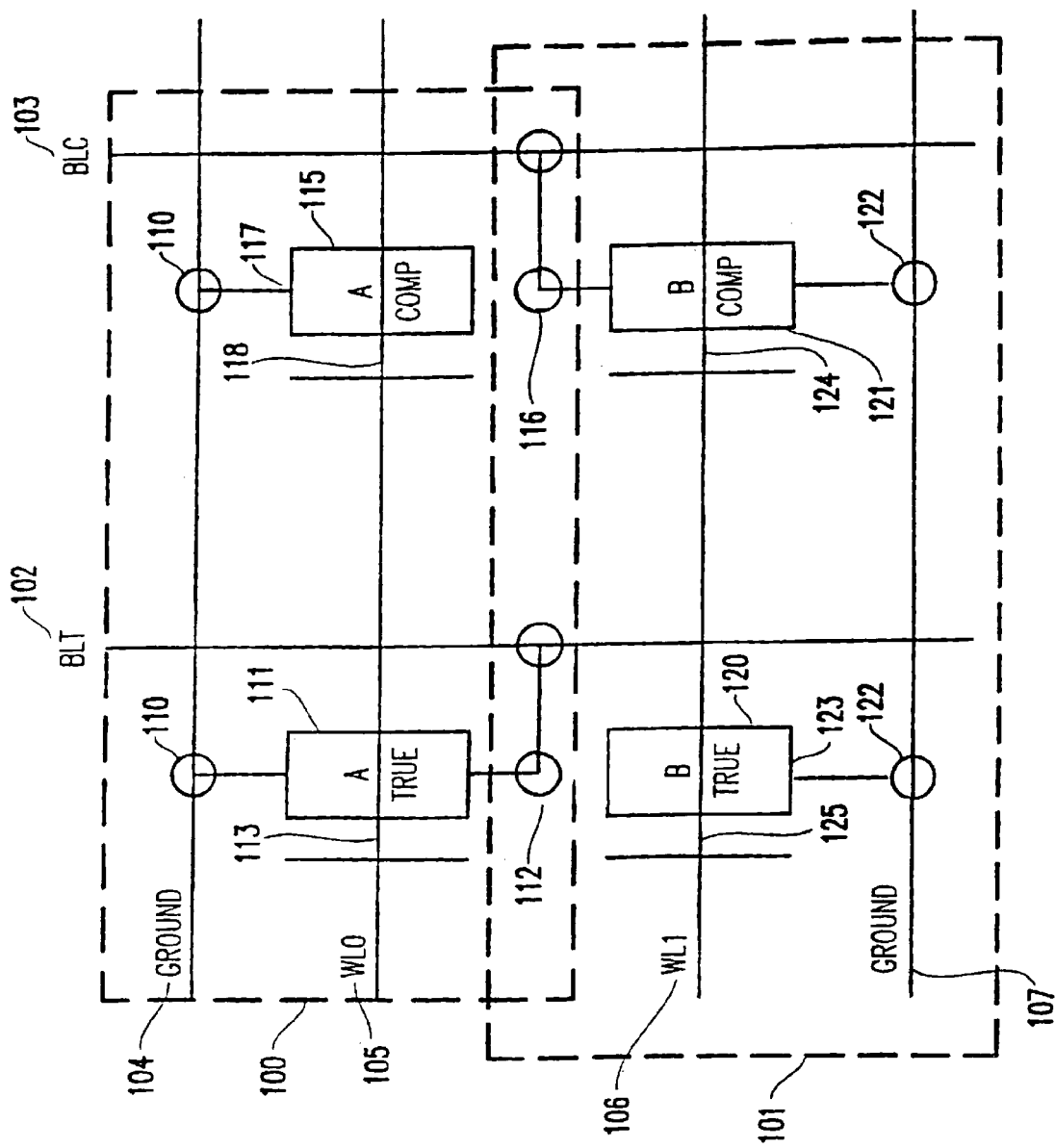
FIG. 7 is a schematic diagram of a two adjacent ROM cells each having two complementary transistors.

While the invention discusses having the source selectively connected to the ground, as would be understood by one ordinarily skilled in the art, different types of transistors could be utilized such that the drain of each of the transistors is selectively connected to the bitline, while the sources of the two transistors share a connection to ground as illustrated in FIG. 7. This configuration uses one less level of metal, but the bitline capacitance becomes variable which reduces robustness and degrades performance.

While the invention discusses having bitlines precharged to VDD with one of two bitlines discharging toward ground, one skilled in the art would understand that opposite voltages could be used where the bitlines are preset to ground and during a read one of these is pulled toward VDD.

Figure 3:
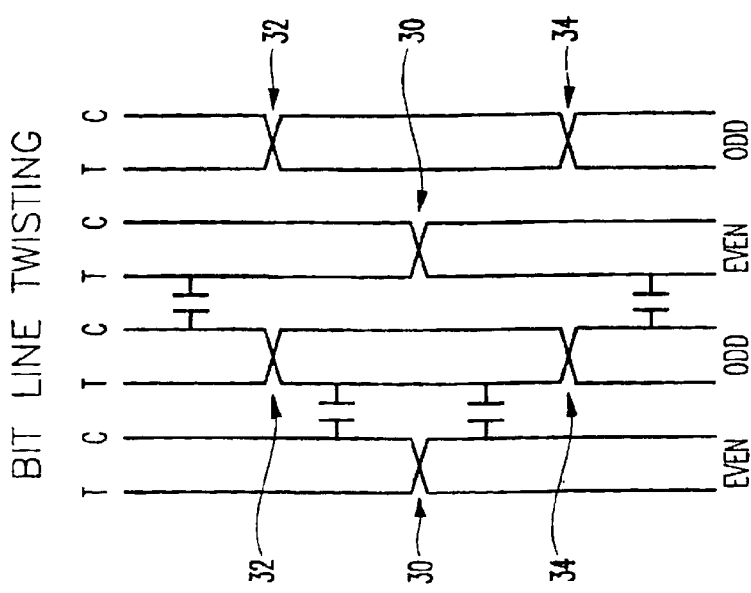
FIG. 3 is a schematic diagram illustrating the true and complement bitline twisting available with the invention.

The invention provides better performance and robustness as compared to prior ROM architectures. Essentially, because of the true/complement arrangement, the invention can use similar performance techniques that static random access memory (SRAM) array structures use. For example, as shown in FIG. 3, bitline twisting can be implemented with even bitlines twisting at the ½ point 30 and odd bitlines twisting at the ¼ and ¾ points 32, 34. With each bitline coupled into itself (predictable) and ¼ of each of the neighboring true/complement lines, the neighbor coupling is exactly 50% of the same level and 50% of the same level and 50% of the opposite level (also very predictablel). If the bitline margin is predictable and consistent, sensing of the signal can happen earlier, improving performance.

Most ROM designs are built with density in mind and use only a one transistor cell to decrease the space consumed. Because of capacitive coupling effects, single transistor arrays either need to be slower (to allow for more signal margin) or need increased space between bitlines and/or have quieting grounds interspersed between bitlines (to reduce coupling). However, with the increased signal margin provided by the inventive complementary two transistor design, the speed of the array can be maintained at a high level without the need to increase the spacing between the transistors. Thus, two transistors per cell does not mean "twice the area". For example, the inventive array is only about 20% larger than conventional architectures. With a two transistor ROM cell, more area is taken up by the cells, but no "quieting grounds" are needed.

Figure 4:
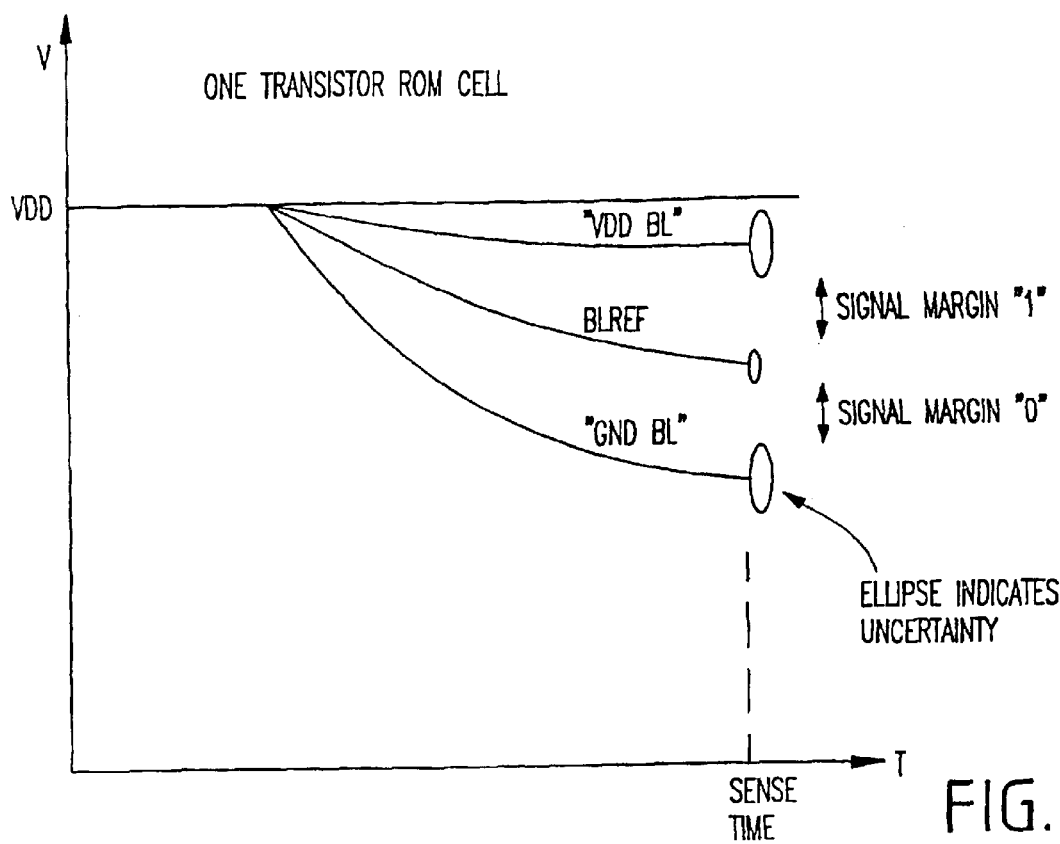
FIG. 4 is a chart illustrating the range of voltages that indicate the nature of programming in conventional ROM cells.
Figure 5:
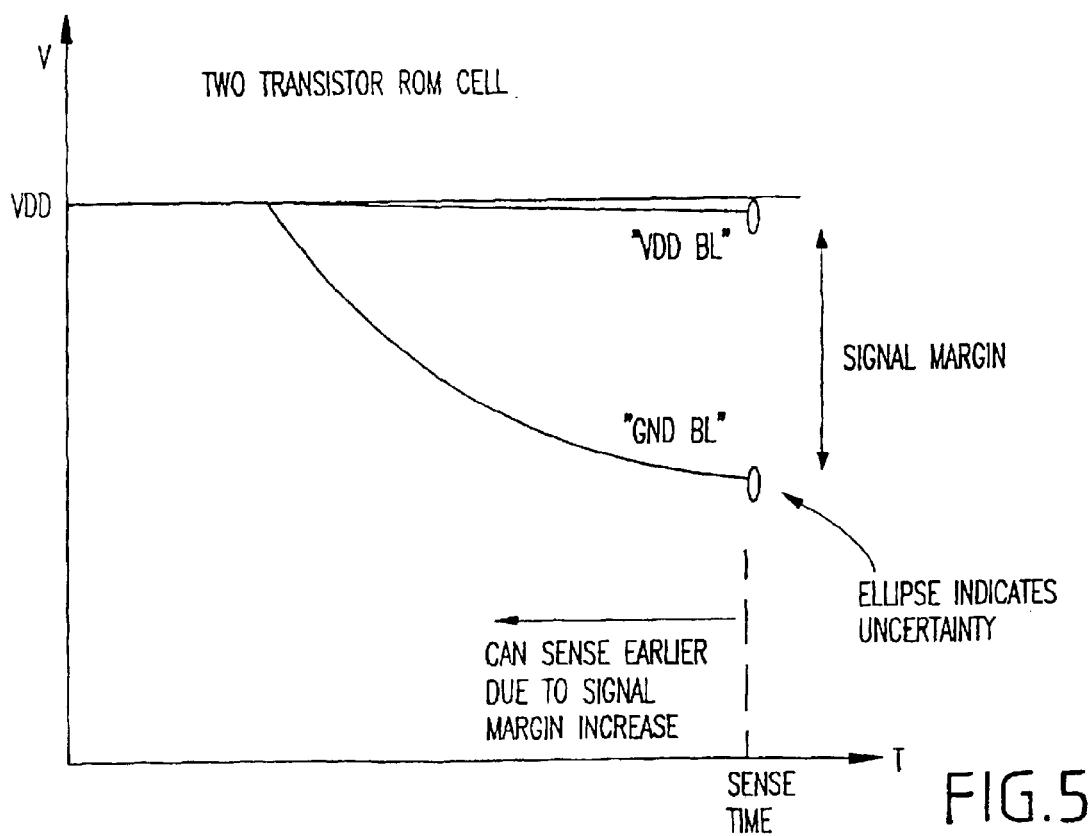
FIG. 5 is a chart illustrating the range of voltages that indicate the nature of programming in the inventive ROM cell.

One important benefit produced with the invention is the dramatic improvement in signal margin; as shown by comparing FIGS. 4 and 5. With the technologies that use a bitline reference signal (discussed above), the signal margin of a logical 1 signal is between the high voltage (VDD BL) and the bitline reference (BLREF), as shown FIG. 4. Similarly, the logical 0 occurs when the read voltage is between the bitline reference (BLREF) and the low voltage (GND BL), as also shown in FIG. 4. Comparing this to the signal margin between the true bitline level (VDD BL) and the complementary bitline the level (GND BL), shown in FIG. 5, the increase in signal margin achieved with the invention can be easily seen. Not only is the signal margin larger with the invention (and therefore easier to identify), the signal can also be sensed earlier, due to the increase in signal margin. Note also that the true and complement bitline voltages have less uncertainty in the invention due to constant capacitance bitlines (described above). Less uncertainty also allows an earlier sense time.

Figure 6:
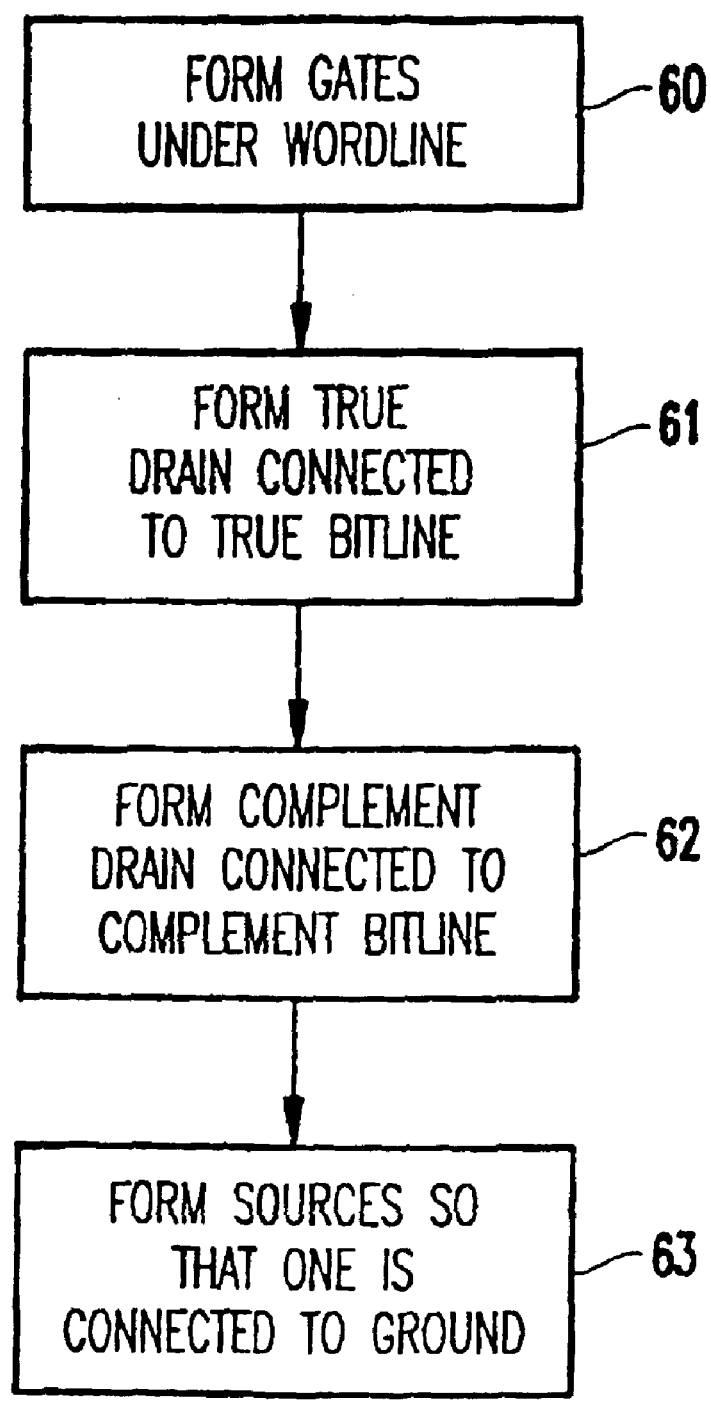
FIG. 6 is a flowchart of the process embodiment of the invention.

The invention also includes a method of forming a read only memory (ROM) cell that is shown in FIG. 6. The invention also forms the gate of each transistor under the wordline, as shown in item 60. In item 61, the invention forms the drain of the true transistor such that the drain is connected to a true bitline and, in item 62, forms the drain of the complement transistor such that the drain is connected to the complement bitline. In item 63, the invention forms the source of the true transistor and the source of the complement transistor such that only one of the two sources is connected to ground. As discussed above, the connection of the source of one of the transistors to ground programs the ROM cell. The forming of the sources only connects one of the sources to the ground and insulates the other of source from electrical connections.

Thus, the invention is further distinguished from some other conventional structures in that the programing occurs during manufacturing and the device does not need to be programmed (e.g., by blowing fuses, making connections, etc.) after manufacture. More specifically, the design of the connections of the sources of the transistors to the ground connection programs each of the cells as a logical 1 cell or a logical 0 cell. As explained above, either the source of the true transistor or the source of the complementary transistor is designed to be connected to ground, in order to program each of the cells.

Thus, the invention provides approximately twice the signal margin that conventional ROM devices provide. At the same time, worst case access and cycle time is improved by more than 25%. All of this improvement in robustness and performance is produced with only about a 20% area increase. Further, because ROMs are typically small and there are not megabits of ROMs on chip designs (unlike SRAMs), this area increase is not critical to overall chip size.

While the invention has been described in terms of preferred embodiments, those skilled in the art will recognize that the invention can be practiced with modification within the spirit and scope of the appended claims.

What is claimed is:

1. A read only memory (ROM) cell connected to a true bitline and a complement bitline, said ROM cell comprising:
   a first transistor having a first drain and a first source; and
   a second transistor having a second drain and a second source,
   wherein said first source and said second source are connected to ground, and
   wherein a connection of only one of said first drain to said true bitline and said second drain to said complement bitline programs said ROM cell.

2. The ROM cell in claim 1, wherein only one of said first drain and said second drain is connected to one of said true bitline and said complement bitline, and the other of said first drain and said second drain is insulated from electrical connections.

3. The ROM cell in claim 1, wherein said connection comprises an electrical connection formed during manufacturing of said first transistor and said second transistor.

4. The ROM cell in claim 1, wherein said first transistor further comprises a first gate connected to a wordline and said second transistor further comprises a second gate connected to said wordline.

5. The ROM cell in claim 1, wherein said second transistor comprises a complement transistor to said first transistor.

6. The ROM cell in claim 1, wherein said ROM cell shares said first source and said second source with corresponding sources of adjacent ROM cells.

* * * * *